(12) United States Patent
Luk et al.

(10) Patent No.: US 6,999,370 B2
(45) Date of Patent: Feb. 14, 2006

(54) LOW POWER CIRCUITS WITH SMALL VOLTAGE SWING TRANSMISSION, VOLTAGE REGENERATION, AND WIDE BANDWIDTH ARCHITECTURE

(75) Inventors: Wing K. Luk, Chappaqua, NY (US); Robert H. Dennard, New Rochelle, NY (US); Stephen V. Kosonocky, Wilton, CT (US)

(73) Assignee: International Business Machines Corporation, Armonk, NY (US)

( * ) Notice: Subject to any disclaimer, the term of this patent is extended or adjusted under 35 U.S.C. 154(b) by 167 days.

(21) Appl. No.: 10/635,331

(22) Filed: Aug. 6, 2003

(65) Prior Publication Data

US 2005/0030817 A1 Feb. 10, 2005

(51) Int. Cl.
*G11C 7/00* (2006.01)
(52) U.S. Cl. .................. 365/226; 365/207; 365/230.03
(58) Field of Classification Search ................ 365/226, 365/207, 230.03, 63

See application file for complete search history.

(56) References Cited

U.S. PATENT DOCUMENTS

| | | | | |
|---|---|---|---|---|
| 6,075,741 A | * | 6/2000 | Ma et al. | ...................... 365/226 |
| 6,292,408 B1 | | 9/2001 | Kawashima | ........... 365/189.11 |
| 6,333,889 B1 | * | 12/2001 | Arimoto | ................. 365/230.03 |
| 6,442,089 B1 | | 8/2002 | Fletcher | ....................... 365/207 |

* cited by examiner

*Primary Examiner*—David Lam
(74) *Attorney, Agent, or Firm*—George Sai-Halasz

(57) ABSTRACT

An integrated circuit, such as a memory macro, includes multiple power rails supporting first and second voltage differentials, with the second voltage differential being smaller than the first voltage differential. Signal lines in the integrated circuit are driven with the small voltage swing, which is generated by small swing circuits. The integrated circuit further includes regeneration circuits, which are receiving small voltage swing inputs and are outputting first, or full voltage swings. The application of the small voltage swing to the signal lines saves power in the integrated circuit. A wide bandwidth, full-wordline I/O, memory integrated circuit has simultaneously operable connection paths between essentially all the memory cells that are attached to the same wordline and the corresponding I/O terminals, and it has a single ended data-line structure.

22 Claims, 6 Drawing Sheets

LOW POWER CIRCUITS WITH SMALL VOLTAGE SWING TRANSMISSION, VOLTAGE REGENERATION, AND WIDE BANDWIDTH ARCHITECTURE

FIELD OF THE INVENTION

The present invention relates to integrated circuits that have high data throughput rates. In particular, an exemplary embodiment of this invention deals with power saving measures involving reduced voltage swings on signal lines, and a wide bandwidth architecture.

BACKGROUND OF THE INVENTION

Today's integrated circuits include a vast number of transistor devices formed in a semiconductor. Smaller devices are the key to enhance performance and to increase reliability. As devices are scaled down, however, the technology becomes more complex and new methods are needed to maintain the expected performance enhancement from one generation of devices to the next.

SUMMARY OF THE INVENTION

Part of the problems is that the high speed of newer integrated circuits results in high power consumption. In CMOS circuits significant fraction of power consumption is the result of dynamic, or active, power. Dynamic power is consumed when capacitors are charged and discharged. In modern integrated circuits a significant fraction of capacitance comes from interconnections. The speed of the integrated circuits often goes together with high data rate transmissions, or so called wide data bandwidths. Each simultaneously transmitted data is ultimately a voltage on an interconnection line, leading to dynamic, or active, power consumption. The problem is that high throughput processors, comprising high performance integrated circuits, need wide data bandwidth at high transfer rates, and consume too much power. This is particularly true with so called embedded memory macros. Such macros comprise part of the processor chips and speed is especially of high premium. Preferably, access time to data residing in a memory macro should be several times shorter than in a typical stand alone memory. Embedded memory macros, whether they are Static Random Access Memories (SRAM), or Dynamic Random Access Memories (DRAM), have inherently high dynamic, or active, power consumption due to high speed and high bandwidth. Reducing speed or bandwidth would result in power saving, but to the detriment of processor performance. It would be desirable to find schemes that result in the most power savings and high data bandwidths.

In view of the problems discussed above an exemplary embodiment of this invention discloses a system and method for saving dynamic, or active, power in high data throughput integrated circuits, and disclosed a high bandwidth architecture. The aim of power reduction is achieved by reducing the voltage swing on interconnects, or buses. The active power consumption is proportional with $f \times C \times V^2$ ($fCV^2$), where, "f" is the frequency, "C" the capacitance, and "V" the voltage swing. Due to the square dependence, reducing V is very effective in decreasing power. Most of the following particulars for embodiments will be given in terms of embedded DRAMs, however for one of ordinary skill in the electronic arts it will be clear that the similar systems and techniques apply to other type of memories as well.

A high performance (embedded) memory requires the movement of wide bandwidth data along global data-buses. The data and control lines are charged and discharged every cycle, dissipating large amount of active $fCV^2$ power. In a representative short cycle embedded DRAM, every 3.2 ns cycle, roughly 256-bits of data have to be moved along the various buses in different parts of the datapath and control pipeline. Assuming a 1V voltage swing and total bus capacitance of 128 pF (about 0.5 pF per bit) for a 1 Mb macro, the dynamic data bus power would be about 40 mW.

An exemplary embodiment of this invention presents a low power design to reduce the active $fCV^2$ bus power by about 50–75%. Higher reduction occurs if two separate power sources are used. The lower limits of power reduction apply if single power source and voltage regulator are used to generate the two voltage sources needed for the low power, low voltage swing scheme. It is achieved by devising a small voltage swing scheme on the major data and control buses. The voltage signals on these interconnects swing only a portion of their traditional full swing values, in the range of approximately 50% of the full swing. An exemplary embodiment of this invention also introduces circuits and associated architectures that make the small swing operations possible and take advantage of them. These schemes involve single ended data-line structure, read and write data-lines, and regeneration circuits for data input/output (I/O) and for writing to the cells. The low voltage swing design also enables good, almost-digital, direct primary and secondary sensing, resulting in clean signal margins. An exemplary embodiment of this invention does not require the use of current sources in secondary sensing, and it has reduced susceptibility to voltage, temperature, and process (VTP) variations.

In the low voltage swing circuits an exemplary embodiment of this invention employs NFET and PFET devices with low threshold voltages to speedup and compensate for the device speed due to lower supply voltage of the FET devices. Such low threshold devices can be used in either static logic, or dynamic logic modes.

An exemplary embodiment of this invention further employs special feedback circuits to bias the well of the NFET and PFET devices, and thus dynamically adjust the thresholds to have the desired value for logic operation and leakage reduction, as well as for VTP compensation.

An exemplary embodiment of this invention also employs voltage level regeneration, or restoring, circuits to convert the small voltage swing signals back to the normal full swing signals when necessary, such as when writing to memory cells and in final I/O operations.

The small voltage swing design saves more in active $fCV^2$ power than it loses due to increased leakage resulting from lowered thresholds. The power consumption due to leakage current Ioff is Ioff×VDD, with VDD being the full voltage of the technology. For instance, if one uses a half VDD voltage swing the $fCV^2$ power is reduced to ¼ compared to full swing. At the same time, for a given clock frequency and supply voltage VDD, the power loss due to the leakage current in lower threshold FET device increases by about a factor of 10. But, since power due to leakage current, Ioff VDD, to begin with is only about 2–5% of the active power in the 100 MHz range, the total power estimation among the full swing and half swing schemes is very favorable at all high frequencies, as the table shows:

|  | 100 MHz | | 300 MHz | | 1 GHz | |
| --- | --- | --- | --- | --- | --- | --- |
|  | Full Swing | Half Swing | Full Swing | Half Swing | Full Swing | Half Swing |
| $fCV^2$ Power | 4 | 1 | 12 | 3 | 40 | 10 |
| Leakage Power 2% | 0.08 | 0.8 | 0.08 | 0.8 | 0.08 | 0.8 |
| Total Power | 4.08 | 1.8 | 12.08 | 3.8 | 40.08 | 10.8 |
| Power Ratio | 100% | 44% | 100% | 31% | 100% | 27% |
| $fCV^2$ Power | 4 | 1 | 12 | 3 | 40 | 10 |
| Leakage Power 5% | 0.2 | 2 | 0.2 | 2 | 0.2 | 2 |
| Total Power | 4.2 | 3 | 12.2 | 5 | 40.2 | 12 |
| Power Ratio | 100% | 71% | 100% | 41% | 100% | 30% |
| $fCV^2$ Power | 4 | 1 | 12 | 3 | 40 | 10 |
| Leakage Power 10% | 0.4 | 4 | 0.4 | 4 | 0.4 | 4 |
| Total Power | 4.4 | 5 | 12.4 | 7 | 40.4 | 14 |
| Power Ratio | 100% | 114% | 100% | 56% | 100% | 35% |

From the table, which is for illustration purposes only and should not be read in a limiting fashion, it is clear that a low swing scheme results in power saving of around 50%, or better. The small swing scheme $fCV^2$ power saving fairs even better when the clock frequency increases.

Accordingly, it is an object of an exemplary embodiment of this invention to teach low power high performance integrated circuits with high data bandwidths, achieved by reduced voltage swings on signal lines.

It is a further object to present a single cycle, very high bandwidth, full-word line I/O, with single ended global bit-line memory, and architecture.

It is a further object to present memory architectures suited to the low voltage swing approach.

It is a further object to present memory architectures and circuits for regenerating and writing full voltage to DRAM cells in conjunction with the low voltage swing approach.

It is a further object to present memory architectures and circuits to regenerating standard voltage level for external logic in conjunction with the low voltage swing approach.

It is yet a further object to teach devices with appropriate thresholds for the low voltage swing approach.

It is also an object to disclose specific circuits for regenerating full voltage swings from the reduced ones.

BRIEF DESCRIPTION OF THE DRAWINGS

These and other features of the present invention will become apparent from the accompanying detailed description and drawings, wherein.

DETAILED DESCRIPTION OF THE INVENTION

An embedded memory macro, such as a DRAM or SRAM macro, is an embodiment of an inherently high bandwidth, high dynamic power consumption integrated circuit. In the disclosed design such a macro has an architecture in which specific signal lines, such as a global data-bus, have a voltage swing which is limited to a portion of the bitline supply voltage during the Read/Write operations. On the other hand, in a DRAM for the reason of maintaining enough signal margin during a Read operation and to have sufficient retention time, full bitline voltage has to be written to a DRAM cell. At the other end of the global data-bus, which is the I/O interface to the external logic, the full voltage of the external logic is interfaced with the reduced voltage of the global data-bus.

Figure 1:
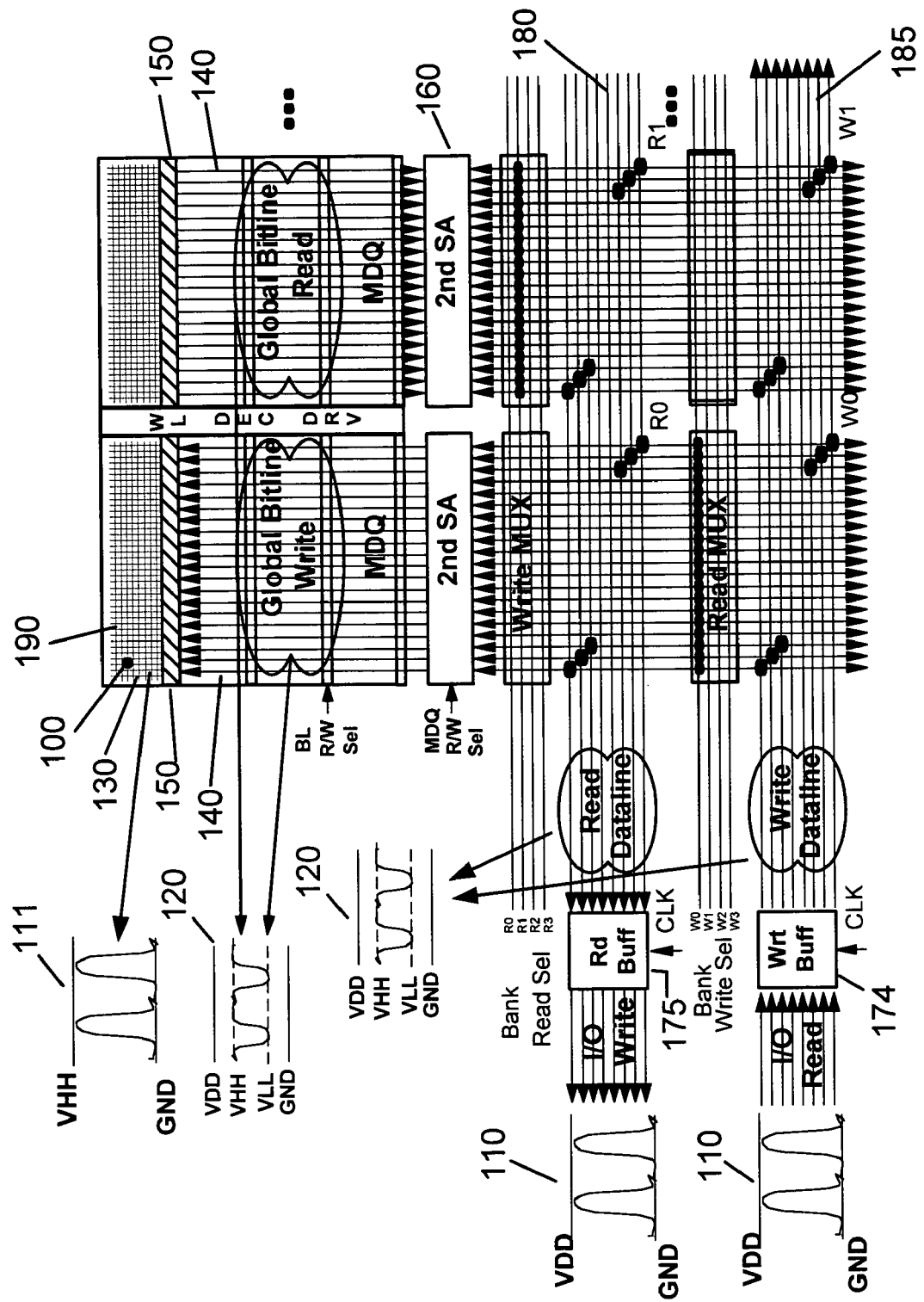
FIG. 1 shows a schematic of a small swing DRAM architecture.

FIG. 1 shows a schematic of a small swing DRAM macro architecture, as an embodiment of an integrated circuit with lowered power consumption. The DRAM cells 100 are at the crossings of bitlines 130 and a wordlines 190. The stored voltage of the cells 100 is a first voltage, or full swing voltage, essentially between VHH and ground (GND), derived from a first voltage differential 111, which is supplied by first power rails in the circuits. The first voltage differential 111 is the one that pertains to the technology in which the DRAM has been built. It is the nominal voltage differential of the DRAM. Without the disclosed low voltage swing scheme the first voltage differential would be the only one supplied for this integrated circuit. Since the voltage state of the cells has to be regularly refreshed, it is important for the voltage difference between a 1 and a 0 state of the cells to be as large as possible, therefore it is determined by the first voltage differential 111. The bitlines 130 lead into the primary sense amplifiers (PSA) 150. During a Read operation the PSA 150 outputs a reduced, or second voltage swing VHH and VLL 120. In the embodiment shown in FIG. 1 the second voltage swing is between VHH and VLL 120, with the high level of the first and second voltage levels coinciding. However, in general this is not the case, the high and low levels of the first and second voltage swing are not coinciding. The reduced, or second voltage swing 120 is derived from a reduced, or second voltage differential supplied by second power rails. This second voltage swing drives the signal lines, which are the global bitlines (MDQ). The circuits with the reduced, or second voltage swing output are the second circuits. During a Write operation the PSA 150 receives the second voltage swing 120 between VHH and VLL from the MDQ 140, and a regeneration circuit amplifies the second voltage swing into the first voltage swing to be written to the cell. The supplied voltage differentials and determine the first and second voltage swings in various parts of the integrated circuit. In normal operations the first and second voltage swings essentially equal the first and second voltage differential of the power rails. However, it can happen under certain loading conditions and/or under the influence of parasitic elements, such as interconnect resistance, that the actual first and second voltage swings differ slightly from the voltage differentials of the rails. The global bitlines, the signal lines, 140 connect to the secondary sense amplifiers (SSA or 2nd SA) 160. These SSA 160 provide a conduit through various multiplexers (MUX) to the Write buffers 174 and the Read buffers 175. Between the SSA 160 and the Read and Write buffers 175 and 174 the read data lines 180 and the write data lines 185 have the second 120, or reduced voltage swing 120, determined by the second voltage differential 120. The Read buffer 175 comprise regeneration circuits to output data from the DRAM. The regeneration circuits in the Read buffer 175 have an output voltage swing to match the voltage swings outside the DRAM macro, consequently these are interface regeneration circuits. The voltage swing outside the DRAM macro between VDD and GND. This interfacing voltage swing 110 between VDD and GND in general is not the same as the first voltage swing 111. The interfacing voltage swing 110 is larger than the reduced, or second voltage swing 120. The Write buffer 174 receives data from the outside at the interfacing voltage swing 110, and has circuits to output the second voltage swing 120 onto the write data-lines 185.

A typical relationship between the values of the first, or nominal voltage swing 111 supported by the first power rails, the second, or reduced voltage swing 120 supported by the second power rails, and the outside or interfacing voltage swing 110, for instance, are: VDD>=VHH>VLL>=GND. In some embodiments having VDD=VHH, or VLL=GND might have advantages, for instance in physically saving in the number of power rails, by sharing lines between the first and second rails. In a state of the art embedded DRAM macro one might apply values such as: VDD=1.2 V, VHH=1.0V, VLL=0.5V, GND=0V. Auxiliary voltages in such a DRAM can be: wordline voltage swing (VPP)>2.0V, and VBB=−0.5 V (for wordline low and DRAM cell well bias). The numerical values, however, change with the progress of the state of the art as one skilled in the art would recognize. What is important is that the reduced, or second voltage swing and second voltage differential is smaller than either the first or interface voltage swings and voltage differentials.

The wide bandwidth requirement of the DRAM macro, which makes the low internal voltage swing advantageous, prefers a specific single ended data-line or global bitline, structure and architecture. (The names data-line and global bitline are in general interchangeable.) Global bitline is specifically a name within DRAM, whereas data-line is generally for data buses. In such an architecture to each bitline in the DRAM array a single global bitline is assigned for the Read/Write operations, instead of the two global bitlines complementary approach used in the usual prior art approach. The single ended data-line structure is necessary for the ultra wide I/O architecture, in which as many bits as possible, preferably all the bits (along the same wordline) are processed in every Read/Write operation. When all the bits in a wordline are Read/Write operated simultaneously, the result is an ultra wide I/O, ultra high bandwidth, the so called full-wordline I/O memory. Without the single ended global bitline structure the width of the data-bus would be limited by the metal wire pitch availability in laying out the data-lines in the DRAM macro. The small global bitline voltage scheme is used in conjunction with the single ended data-line structure to achieve wide I/O, high bandwidth, and low power.

A single ended primary sense amplifier 150 with local storage and write-back capability is designed for wide bandwidth DRAM architecture. The primary sense amplifier 150 is operated in a single ended fashion, i.e. input from a single ended bitline, and output to a single ended global bitline. The sense amplifier can also serve as a local storage (latch) to hold the cell data, and write-back to the DRAM cell.

In a wide bandwidth, full-wordline I/O, memory architecture one operates, for instance Reads, Writes, Refreshes, etc., simultaneously on essentially all memory cells that are attached to the same wordline. The memory cells attached to the same wordline form a string of memory cells. Reading or Writing to essentially all memory cells which are attached to the same wordline means that no significant subsets of cells are left out of the operation, such as operating simultaneously only, for instance, on every second memory cell attached to the wordline. Operating simultaneously typically means operating in a single cycle. Essentially all memory cells attached to the same wordline generally means all cells, except that as one skilled in the art would recognize, sometimes there may be a small number of redundant cells attached to any given wordline, serving a variety of purposes other than information storing. Accordingly, for simultaneous, or one cycle operation of a string of memory cells, which are essentially all the memory cells attached to the same wordline, one has to provide simultaneously operable connection paths between the string of memory cells and the corresponding Input/Output terminals. For illustration such a path is followed on FIG. 1 starting with the cell 100. However, the direction of traversing, namely from cell toward I/O, is not important, it is for illustration only. In FIG. 1 a typical such path connects the memory cell 100, (activated by the wordline 190) to the bitline 130, to the PSA 150, to the global bitline 140, to the SSA 160, and then depending on the operation, either to the read data-line 180 and Read buffer 175, or to the write data-line 185 and Write buffer 174. As one in the skilled in the art would recognize, although the details of the path connecting the memory cell to of from the Input/Output might differ depending on particulars, the important aspect is that one supplies this connection, for both direction of information flow, namely from cell to I/O and from I/O to cell, for all the memory cells of the string. The simultaneously activated memory cells in such a wide bandwidth architecture can be well into the thousands. A single ended data-line structure where one cell 100 on the string is served by only one global bitline 140, is key to the wide bandwidth memory. The single ended data-line structure does not overcrowd the wire pitch availability for the data-lines in the memory. The usage of small, or second voltage swing on the signal lines is desirable for power reduction in the wide bandwidth architecture memory. A typical implementation of a wide bandwidth memory is a wide bandwidth DRAM, as is illustrated in FIG. 1. However such a wide bandwidth scheme is applicable to any memory which is serving wide bandwidth needs, for instance, to various static memories as well.

Figure 2A:
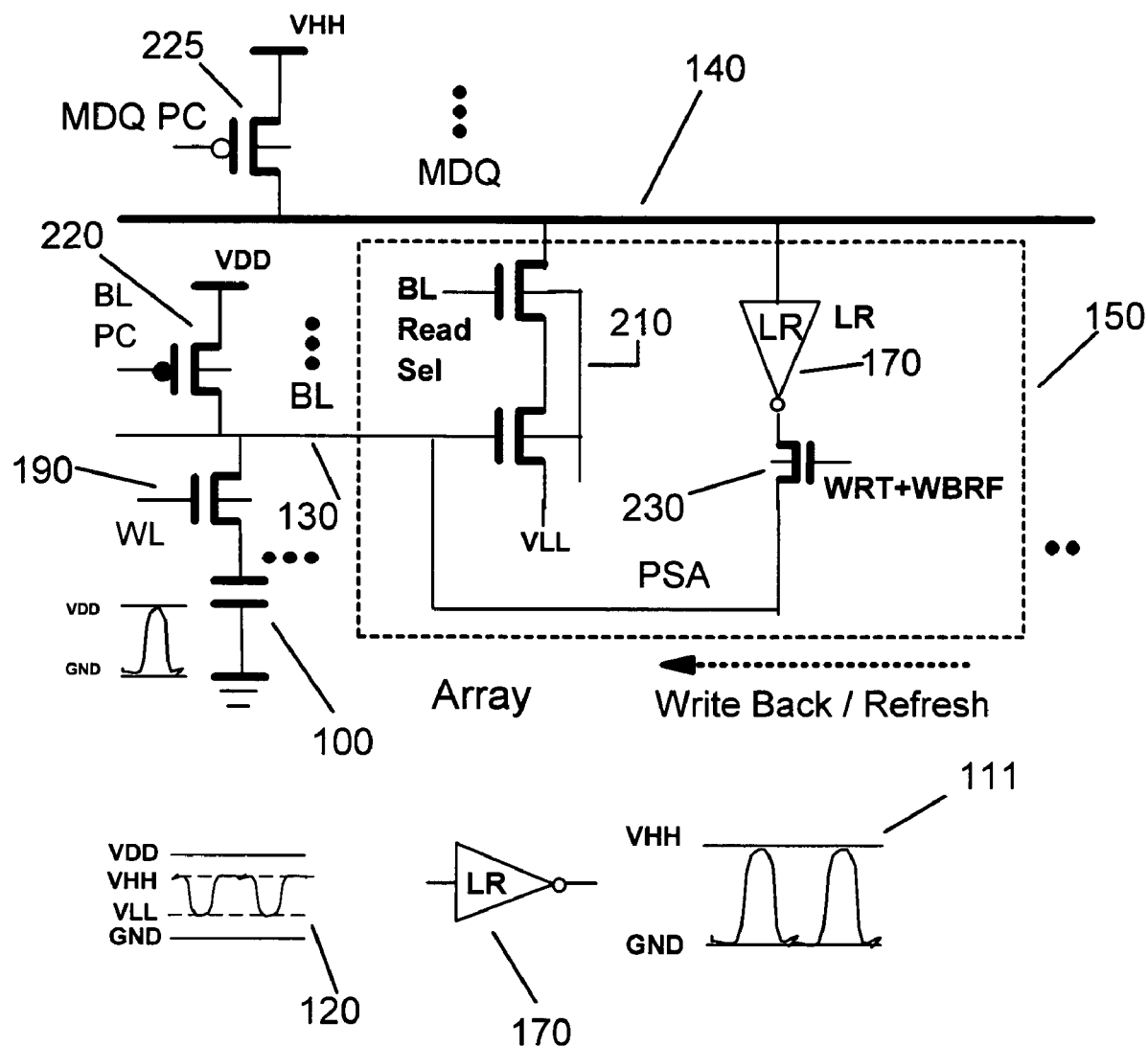
FIG. 2 shows schematics of low power hierarchal sensing, with local writeback options.

FIG. 2A is a schematic of the cell, bitline, signal line (the global bitline), and single ended primary sense amplifier with local storage and write-back capability. During a Read operation, if the cell 100 stored a 0, the bitline 130 goes low and the single ended global bitline 140 stays at its precharged 225 value of VHH, as the bitline 130 was precharged 220 to VHH. If the cell 100 stored a 1, the bitline 130 stays at VHH and the single ended global data-line 140 drops to VLL. VLL is the "low" voltage of the small voltage swing scheme. Here VHH bitline precharge is assumed, other bitline precharging scheme would work accordingly, as one ordinarily familiar with the art would recognize. As a result, the cell voltage swings between GND and VHH, and the signal line, the global bitline, driven between VLL and VHH, a portion of the full bitline voltage swing between GND and VHH.

The dashed box is the single ended primary sense amplifier PSA with local storage and write-back capability 150, meaning capability for local Write/WriteBackRefresh (WRT/WBRF). Local WRT/WBRF capability is a possible option for the Write path 230. Since the MDQ 140 has a small, or second voltage swing, and the cell 100 need a full, or first voltage swing, the PSA 150 comprises a restoring, or regenerating, circuit 170, which amplifies the second voltage swing determined by the second voltage differential 120 into the first voltage swing determined by the first voltage differential 110.

The threshold voltage of the sensing device is dynamically adjusted 210 by biasing the well from a feedback circuit which monitors voltage, temperature, and process (VTP) variations. Dynamic adjustment of device thresholds with well biasing is known by those ordinarily skilled in the art. For instance U.S. patent application Ser. No. 09/917,059 filed Jul. 17, 2001 incorporated herein by reference, and U.S. Pat. No. 6,518,827 entitled: "Sense Amplifier Threshold Compensation" to J. Fifield et al, incorporated herein by reference, teaches such a device threshold dynamic adjustment. Accordingly the transition voltage point (Vx) of the PSA device is adjusted to be roughly mid-way between the bitline 130 read 0 and read 1. This results in a very desirable signal margin for this direct sensing scheme. It is almost—fully "on" when reading a 1 and almost "off" when reading a 0.

A voltage level restoring, or regeneration, LR circuit 170 is used to restore small voltage swing signal on the MDQ 140 to full DRAM cell 100 voltage. In the Write back and data-in operations, the MDQ voltage is written back to the DRAM cell; restored to GND for 0 data, and restored to VHH for 1 data.

The device thresholds in the voltage level regeneration LR circuit 170 are set dynamically by adjusting the well voltages of the NFET and PFET devices using specific circuits for assuring proper logic operation and leakage current reduction, as well as for compensating for VTP variations.

Figure 2B:
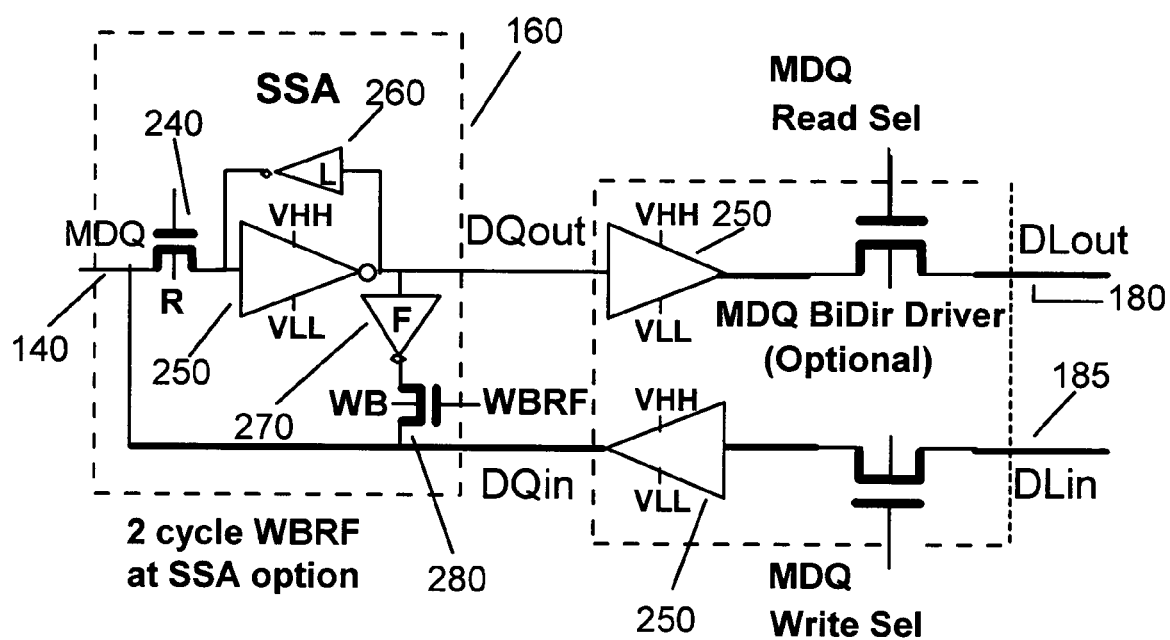

FIG. 2B shows the SSA and with optional WBRF. The MDQ 140 (coming from the PSA 150) has a small, or second voltage swing determined by the second voltage differential 120, and is received in the small swing logic 250, with second power rails between VLL and VHH. The transition voltage Vx of the SSA 160, operating between VHH and VLL, is set to be between VLL and VHH, so it can sense and detect the MDQ 140 with desirable signal margin, without the use of current sources. Further, the wells of the NFET and PFET devices of the SSA are again dynamically biased according to VTP variations, using feedback monitoring circuits to obtain the optimal transition voltage point Vx.

The SSA output is of reduced, or second, voltage swing and it is gated through the MUX device (MDQ Read Sel) to the data read bus 180 (DLout) for output. During a Write operation the data write bus 185 is gated through the MUX device (MDQ Write Sel) and eventually routed to the MDQ 140. The devices 240, 260, 270, and 280 serve as control logic when the WBRF operation is done from the SSA. The following table summarizes the operational state of these logic circuits, depending whether the WBRF operation is done from the PSA 150, or the SSA 160.

|  | LR, 170 | R, 240 | L, 260 | F, 270 | WB, 280 |
| --- | --- | --- | --- | --- | --- |
| PSA WriteBack | yes | no | option | no | no |
| SSA WriteBack | yes | yes | yes | yes | yes |

WriteBack can be local at PSA, or at remote SSA. Local WriteBack yields smaller power, remote WriteBack yields smaller area. Local WriteBack writes better voltage to cells. In each case there is a one cycle or two cycle writeback option.

The following table summarizes the state of the RD, WRT, MDQ Read Sel, MDQ Write Sel, and WBRF control lines, during the WrtBk/Refrh, Read, Write, and Bank off cycles:

| Status | WrtBk/Refrh | Read | Write | Bank off |
| --- | --- | --- | --- | --- |
| RD | 1 | 1 | 0 | 0 |
| WRT | 0 | 0 | 1 | 0 |
| MDQ Read Sel | 0 | 1 | 0 | 0 |
| MDQ Write Sel | 0 | 0 | 1 | 0 |
| WBRF | 1 | 0 | 0 | 0 |

Figure 3:
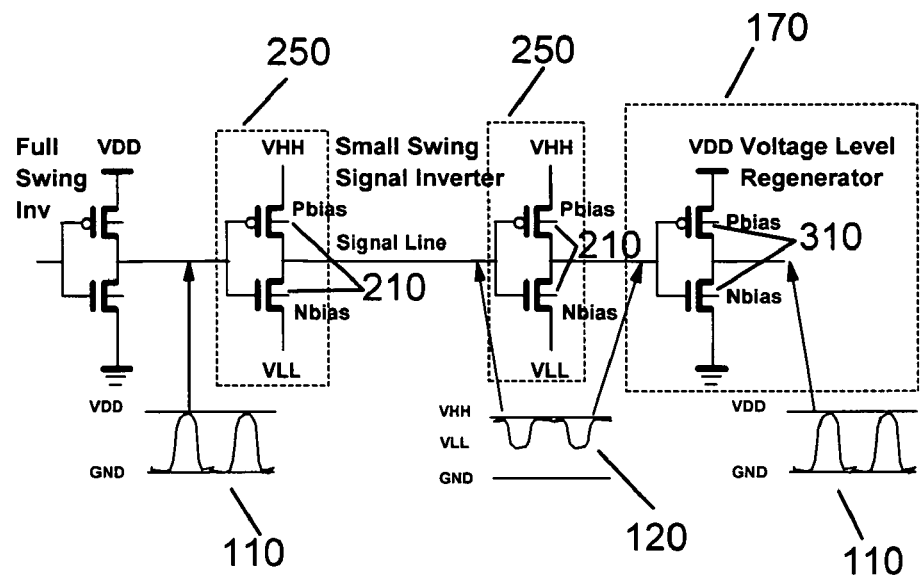
FIG. 3 shows schematic of low voltage swing inverters and a low to full voltage swing regenerator.

FIG. 3 shows schematics of low voltage inverters and a voltage swing regenerator circuits. The small signal inverters 250, all of them second circuits, have their source tied to VLL and their drain tied to VHH. Accordingly their output nominally swings between VLL and VHH, giving a second voltage swing output, independently whether their input is a first, or full voltage or a second, low voltage. A regeneration circuit, in this case for illustration purposes an interface regeneration circuit, 170 has its source tied to GND and its drain tied to VDD. Accordingly its output gives a interfacing voltage swing between GND and VDD, although the input is second, or low voltage swing.

Figures 4A, 4B:
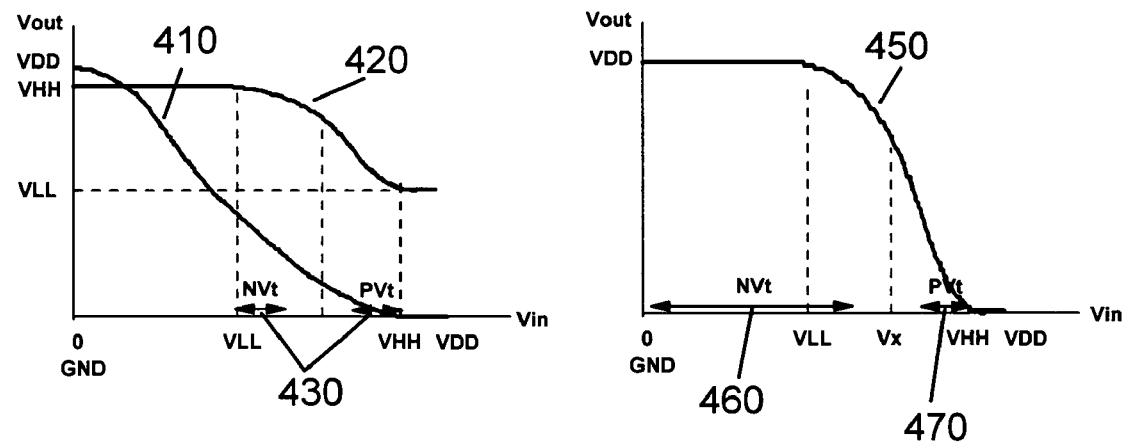
FIG. 4 shows inverter transfer functions and thresholds.

In the regular NFET and PFET devices having full voltage input and output, the device thresholds pertain to the technology of the integrated circuit they are part of. The size of a threshold pertaining to a given technology level is determined by the requirements of keeping subthreshold leakage low, while giving sufficient overdrive for carrying large currents. For the sake of proper operation the small signal device 250 and regeneration device 170 thresholds deviate from the device thresholds pertaining to the technology that they are part of. FIG. 4 shows inverter transfer functions and thresholds for the second circuits, or low voltage swing circuits, 250 in FIG. 4A, and for regeneration circuits 170 in FIG. 4B. In FIG. 4A curve 410 shows the transfer characteristics of a regular full swing voltage inverter, such as an interface regeneration circuit, swinging between GND and VDD. Curve 420 is the transfer curve of a reduced, or second voltage swing device, between VHH and VLL. Since the voltage swing range is reduced, the thresholds NVt and PVt 430 of the NFET and PFET devices are low thresholds, smaller than the device thresholds pertaining to the technology of the integrated circuit containing the full swing NFET and PFET devices. For the regeneration circuits 170 in FIG. 4B the curve 450 shows the transfer characteristics, namely that the output swings between GND and VDD while the input between VLL and VHH. The size of NVt and PVt thresholds of the regeneration circuits are custom thresholds and are derived from the first and second, or outside and second power rails voltage differentials. Their custom value is derived from the relative positions of the high and low values of the various power rail voltage differentials. For the case shown in FIG. 4, when the voltage swing goes from between VLL and VHH to between GND and VDD the relevant values are VDD, VHH, VLL and GND. The PFET threshold of the regeneration devices has to be slightly larger than VDD-VHH, and the NFET threshold of the regeneration devices has to be slightly larger than VLL-GND. Accordingly, NVt and PVt in the regeneration devices maybe bigger or smaller than the device thresholds pertaining to the technology of the integrated circuit containing the full swing NFET and PFET devices, depending on the size of VDD-VHH and of VLL-GND. In FIG. 4B, VDD and VHH almost coincides, while VLL is significantly larger the GND. As a result of such a lineup NVt is larger, and PVt is smaller than the device thresholds pertaining to the technology of the integrated circuit containing the full swing NFET and PFET devices. In general the situation is that the regeneration devices have custom thresholds, which custom thresholds are derived from the first, second, and further voltage differentials, such as the illustrated VDD-VHH and VLL-GND differences.

As disclosed earlier, dynamic adjustment of thresholds is preferable for all cases, but one skilled in the art would realize that this is not necessary. The devices can be fabricated already with the desired threshold values.

Depending on the particular needs of the integrated circuit the second voltage differential can be generated right on the chip which houses the integrated circuit. Alternatively, the second voltage differential can be generated off the chip, which houses the integrated circuit, and supplied to the circuits from the outside.

Figure 5A:
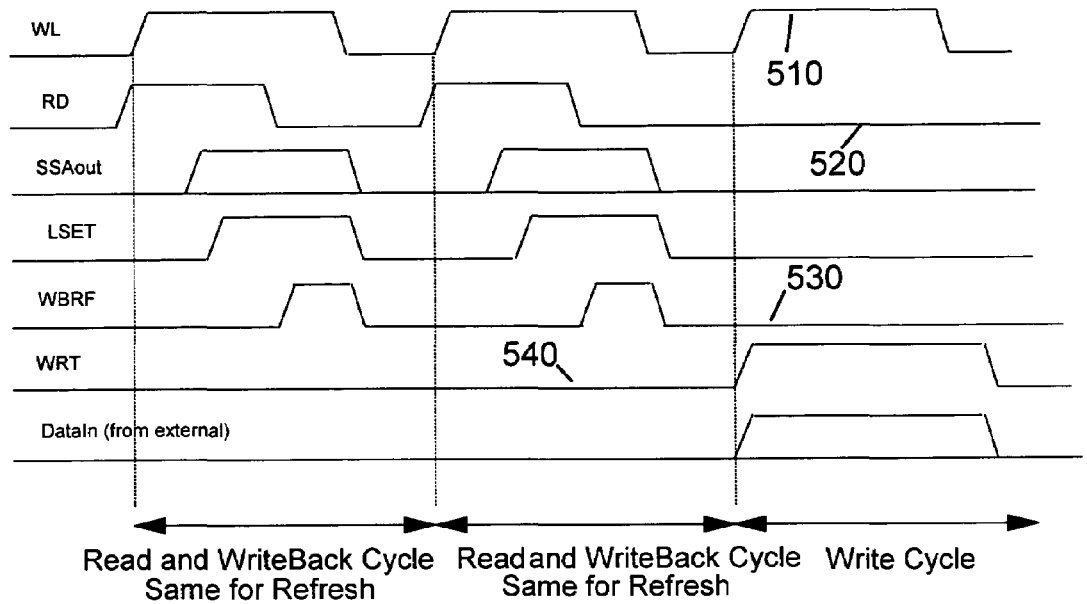
FIG. 5 shows the timings of one and two cycle Read and WriteBack/Refresh operations.
Figure 5B:
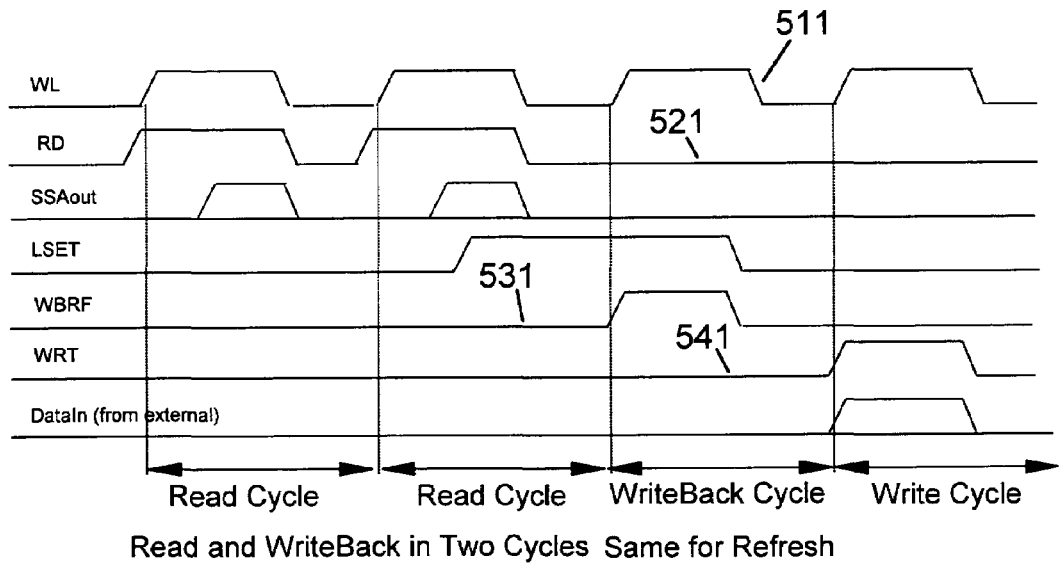

FIG. 5 shows the timings of one and two cycle read and writeback/refresh operations. The low voltage swing low power DRAM architectural scheme allows for options in choosing timings during cycles. It is possible to accomplish a Read and a WriteBack/Refresh operation within one cycle, as shown on FIG. 5A, or alternatively to do a Read and a WriteBack/Refresh operation in two cycles, as shown on FIG. 5B. In each case the wordline (WL) 510 up and down swing defines one cycle. In the one cycle scenario the RD control signal 520 arrives at the beginning of the cycle, and after Read is completed the WBRF operation 530 can also complete before the WL 520 falls. Writing of the cell due to an external Datain takes a separate cycle 540.

In an alternative embodiment the WL cycles faster 511, and during the WL "on" either a Read 521, or a WBRF 531, but not both can be accomplished. Thus these two operations take two cycles to complete. Again, writing of the cell due to an external Datain takes a separate cycle 541.

When the Read and WBRF operations are separated to take up two cycles, as in FIG. 5B, the cycle time can typically be 25% to 30% shorter than when the Read and WBRF operations are done in the same cycle. For state of the art embedded DRAMs the cycle time in the two cycle RD and WBRF embodiment can be around 3.3 ns, while in the one cycle RD and WBRF embodiment it can be around 4.5 ns.

Figure 6B:
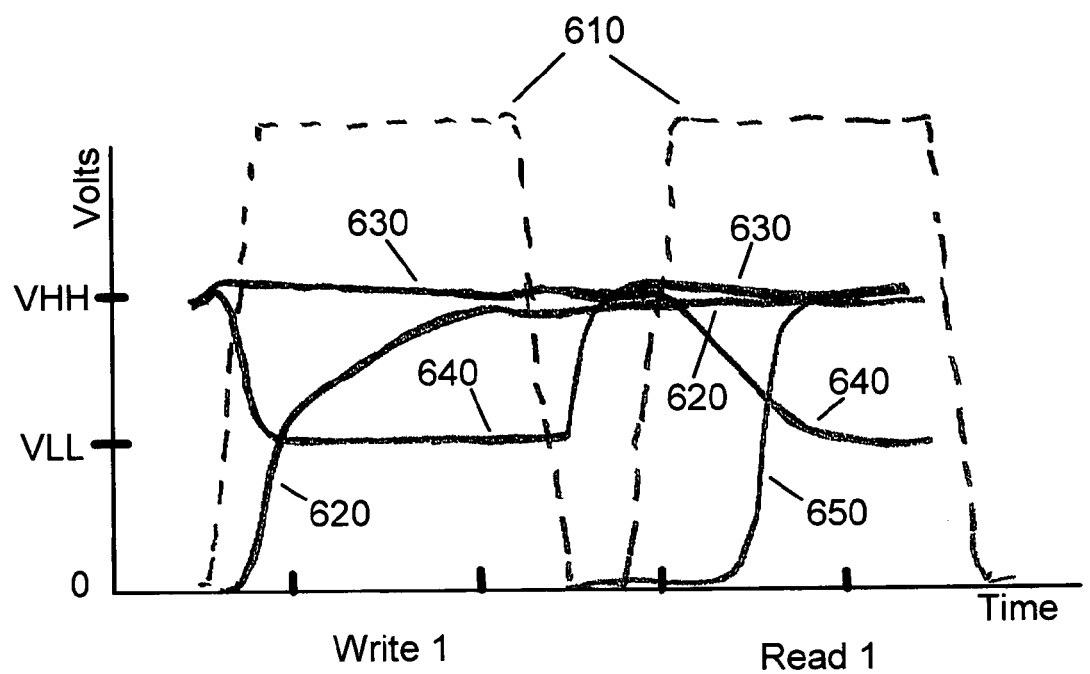
FIG. 6 shows DRAM voltage swings during read and write cycles.
Figure 6B:
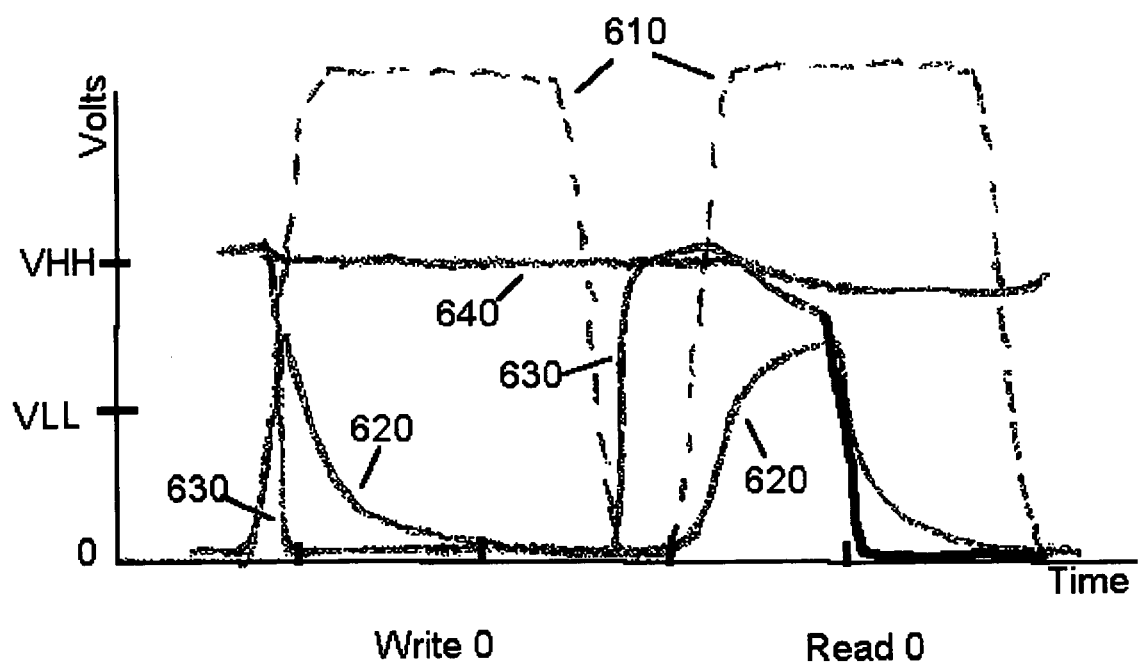

FIG. 6 shows voltage swings during read and write cycles appearing on significant nodes of the DRAM. FIG. 6A shows two cycles with a 1 being written during the first cycle and a 1 being read during the second cycle. Again the cycles are defined by the wordline swings 610. In the depicted case the relation of the reduced voltage differentials to the full voltage differentials are such that the high value of the first and second voltage differentials are coinciding at VHH, while VLL is approximately half the size of VHH. The voltage swing on the wordline is between GND and a value larger than VHH, as is customary in DRAMs. The curve 620 shows the voltage on the cell 100. The cell swing is a full, or first voltage swing. As is shown on FIG. 6A, when writing a 1, by the end of the cycle the cell voltage is VHH. The bitline 630 is high, near VHH throughout, since it too has a full, (first voltage) swing. The MDQ curve 640 goes from a precharge high value of VHH to the low of VLL, since signal lines, such as global bitlines have a reduced, (second voltage) swing. In the subsequent read 1 cycle, of FIG. 6A, the cell voltage 620 and the bitline voltage 630 both stay high at VHH, while the MDQ again drops to VLL, having been precharged to VHH during the wordline down time of the cycle. Curve 650 is the dataout voltage at the I/O of the chip, indicating the just read 1 value, by swinging up a first voltage from GND to VHH toward the end of the cycle. The I/O operations, as discussed earlier, are at full (first voltage) swings. The same voltage curves are shown in FIG. 6B during a write 0 and a read 0 cycle. The full (first voltage) swing bitline 630 drops to GND and pulls down the cell voltage 620 to GND during write 0. The MDQ stays at its high level VHH during this activity. Before the wordline goes high in the read 0 cycle, the bitline 630 has been precharged to VHH. When the wordline rises the bitline voltage 630 and cell voltage 620 approach one another and then during a writeback both eventually go down to GND. During the read 0 MDQ 640 drops somewhat but finally stays at its VHH level.

The figures referred to a DRAM embodiment, however the low voltage swing scheme is applicable to any circuit with wide data paths and fast data transmission rates. SRAMs, for instance, can benefit from such a scheme, in the same manner as embedded DRAMs.

Many modifications and variations of the present invention are possible in light of the above teachings, and could be apparent for those skilled in the art. The scope of the invention is defined by the appended claims.

We claim:

1. An integrated circuit, comprising
   first power rails supporting a first voltage differential;
   second power rails supporting a second voltage differential, wherein said second voltage differential is smaller than said first voltage differential;
   a plurality of second circuits outputting a second voltage swing, wherein said second voltage swing is determined by said second voltage differential;
   a plurality of signal lines, wherein said signal lines are driven by said second voltage swing; and
   a plurality of regeneration circuits, wherein said regeneration circuits are receiving said second voltage swing and are outputting a first voltage swing, wherein said first voltage swing is determined by said first voltage differential.

2. The integrated circuit of claim 1, wherein in said second circuits NFET and PFET devices have low thresholds, wherein said low thresholds are lower than those thresholds which pertain to the technology of said integrated circuit.

3. The integrated circuit of claim 2, wherein in said second circuits said low thresholds are dynamically adjusted.

4. The integrated circuit of claim 1, wherein in said restoring circuits NFET and PFET devices have custom thresholds, wherein said custom thresholds are derived from said first and second voltage differentials.

5. The integrated circuit of claim 4, wherein in said restoring circuits said custom thresholds are dynamically adjusted.

6. The integrated circuit of claim 1, wherein said integrated circuit is a DRAM, and said signal lines comprise global bit-lines.

7. The integrated circuit of claim 6, wherein memory cells in said DRAM are written with said first voltage swing.

8. The integrated circuit of claim 6, further comprising interface regeneration circuits, wherein said interface regeneration circuits are receiving said second voltage swing and are outputting an interfacing voltage swing, wherein said interfacing voltage swing is larger than said second voltage swing, and wherein I/O operations in said DRAM are performed with said interfacing voltage swing.

9. The integrated circuit of claim 6, wherein said DRAM has a single ended data-line structure.

10. The integrated circuit of claim 9, wherein a Read and a subsequent WriteBack operation occurs in one cycle, wherein said integrated circuit operates in cycles.

11. The integrated circuit of claim 9, wherein a Read and a subsequent WriteBack operation occurs in more than one cycle, wherein said integrated circuit operates in cycles.

12. The integrated circuit of claim 9, further comprising a single ended primary sense amplifier with local storage and write-back capability.

13. The integrated circuit of claim 6, wherein said DRAM is an embedded DRAM macro.

14. A wide bandwidth memory, comprising:
simultaneously operable connection paths between a string of memory cells and corresponding Input/Output terminals, wherein said string of memory cells are essentially all the memory cells which are attached to the same wordline, wherein said wide bandwidth memory has a plurality of wordlines and a plurality of memory cells;
a single ended data-line structure;
first power rails supporting a first voltage differential;
second power rails supporting a second voltage differential, wherein said second voltage differential is smaller than said first voltage differential;
a plurality of second circuits outputting a second voltage swing, wherein said second voltage swing is determined by said second voltage differential;
a plurality of signal lines, wherein said signal lines are driven by said second voltage swing; and
a plurality of regeneration circuits, wherein said regeneration circuits are receiving said second voltage swing and are outputting a first voltage swing, wherein said first voltage swing is determined by said first voltage differential.

15. The wide bandwidth memory of claim 14, wherein said wide bandwidth memory is a DRAM.

16. The wide bandwidth memory of claim 15, further comprising a single ended primary sense amplifier with local storage and write-back capability.

17. A processor, comprising:
at least one embedded memory macro, wherein said at least one embedded memory macro is further comprising:
first power rails supporting a first voltage differential;
second power rails supporting a second voltage differential, wherein said second voltage differential is smaller than said first voltage differential;
a plurality of second circuits outputting a second voltage swing, wherein said second voltage swing is determined by said second voltage differential;
a plurality of signal lines, wherein said signal lines are driven by said second voltage swing; and
a plurality of regeneration circuits, wherein said regeneration circuits are receiving said second voltage swing and are outputting a first voltage swing, wherein said first voltage swing is determined by said first voltage differential.

18. The processor of claim 17, wherein said least one embedded memory macro has a single ended data-line structure.

19. The processor of claim 17, wherein said least one embedded memory macro is an embedded DRAM.

20. A method for conserving power in an integrated circuit, comprising the steps of:
providing said integrated circuit with power rails supporting a reduced voltage differential, wherein said reduced voltage differential is smaller than a nominal voltage differential of said integrated circuit; and
driving signal lines in said integrated circuit with a reduced voltage swing, wherein said reduced voltage swing is determined by said reduced voltage differential.

21. The method of claim 20, wherein said integrated circuit is chosen to be an embedded DRAM macro, and said signal lines are chosen to be global bit-lines.

22. The method of claim 21, wherein said embedded DRAM macro is chosen to have a single ended data-line structure.

* * * * *